United States Patent
Huang et al.

(10) Patent No.: US 6,831,003 B1
(45) Date of Patent: Dec. 14, 2004

(54) CONTINUOUS BARRIER FOR INTERCONNECT STRUCTURE FORMED IN POROUS DIELECTRIC MATERIAL WITH MINIMIZED ELECTROMIGRATION

(75) Inventors: Richard J. Huang, Cupertino, CA (US); Pin-Chin C. Wang, Menlo Park, CA (US); Darrell M. Erb, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 221 days.

(21) Appl. No.: 10/161,451

(22) Filed: May 31, 2002

(51) Int. Cl.[7] .......................................... H01L 21/4763
(52) U.S. Cl. ...................... 438/627; 438/629; 438/643; 438/648; 438/653; 438/656; 438/685; 438/687
(58) Field of Search ................................ 438/627, 629, 438/643, 648, 653, 656, 685, 687

(56) References Cited

U.S. PATENT DOCUMENTS

| | | | |
|---|---|---|---|
| 6,008,540 A | 12/1999 | Lu et al. ....................... | 257/758 |
| 6,100,587 A * | 8/2000 | Merchant et al. ............ | 257/751 |
| 6,346,484 B1 | 2/2002 | Cotte et al. .................. | 438/725 |
| 6,410,419 B1 * | 6/2002 | Merchant et al. ............ | 438/628 |
| 6,451,712 B1 | 9/2002 | Dalton et al. ................ | 438/781 |
| 6,482,733 B2 | 11/2002 | Raaijmakers et al. ........ | 438/633 |
| 6,528,409 B1 * | 3/2003 | Lopatin et al. .............. | 438/618 |
| 2002/0034873 A1 * | 3/2002 | Aoi ............................. | 438/627 |
| 2002/0076935 A1 | 6/2002 | Maex et al. .................. | 438/706 |
| 2002/0084529 A1 | 7/2002 | Dubin et al. ................. | 257/774 |
| 2002/0117760 A1 | 8/2002 | Gates et al. .................. | 257/774 |
| 2002/0127844 A1 | 9/2002 | Grill et al. ................... | 438/622 |
| 2002/0132466 A1 | 9/2002 | Lin et al. ..................... | 438/619 |
| 2002/0155700 A1 * | 10/2002 | Chen et al. ................... | 438/639 |
| 2002/0164891 A1 | 11/2002 | Gates et al. .................. | 438/780 |
| 2002/0173142 A1 * | 11/2002 | Vanhaelemeersch et al. ..... | 438/637 |
| 2002/0177303 A1 | 11/2002 | Jiang et al. .................. | 438/653 |
| 2003/0134508 A1 * | 7/2003 | Raaijmakers et al. ........ | 438/638 |
| 2004/0130032 A1 * | 7/2004 | Gronbeck et al. ............ | 257/759 |

FOREIGN PATENT DOCUMENTS

| | | |
|---|---|---|
| EP | 1195801 | 4/2002 |
| FR | 2819635 | 7/2002 |

* cited by examiner

Primary Examiner—Lynne A. Gurley
(74) Attorney, Agent, or Firm—Monica H. Choi

(57) ABSTRACT

For filling an interconnect opening within a porous dielectric material, a diffusion barrier material is deposited onto at least one sidewall of the interconnect opening. A thickness of the diffusion barrier material is equal to or greater than a radius of a pore opened at the sidewall to substantially fill the opened pore. The thickness of the diffusion barrier material is equal to or greater than a mean radius of pores opened at the sidewall to substantially fill a majority of the opened pores. Or, the thickness of the diffusion barrier material is equal to or greater than a radius of a largest pore opened at the sidewall to substantially fill all opened pores. The interconnect opening is then filled with a conductive fill material.

14 Claims, 7 Drawing Sheets

CONTINUOUS BARRIER FOR INTERCONNECT STRUCTURE FORMED IN POROUS DIELECTRIC MATERIAL WITH MINIMIZED ELECTROMIGRATION

TECHNICAL FIELD

The present invention relates generally to fabrication of interconnect structures within integrated circuits, and more particularly, to minimizing electromigration failure of an interconnect structure formed in porous low-K dielectric material.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Thus far, aluminum has been prevalently used for metallization within integrated circuits. However, as the width of metal lines are scaled down to smaller submicron and even nanometer dimensions, aluminum metallization shows electromigration failure. Electromigration failure, which may lead to open and extruded metal lines, is now a commonly recognized problem. Moreover, as dimensions of metal lines further decrease, metal line resistance increases substantially, and this increase in line resistance may adversely affect circuit performance.

Given the concerns of electromigration and line resistance with smaller metal lines and vias, copper is considered a more viable metal for smaller metallization dimensions. Copper has lower bulk resistivity and potentially higher electromigration tolerance than aluminum. Both the lower bulk resistivity and the higher electromigration tolerance improve circuit performance.

Referring to FIG. 1, a cross sectional view is shown of a copper interconnect 102 within a trench 104 formed in an insulating layer 106. The copper interconnect 102 within the insulating layer 106 is formed on a dense dielectric material 109 deposited on a semiconductor wafer 108 such as a silicon substrate as part of an integrated circuit. The dense dielectric material 109 may be a hardmask layer, an etch stop layer, or a capping layer comprised of $SiO_2$ (silicon dioxide) or SiN (silicon nitride) for example. Because copper is not a volatile metal, copper cannot be easily etched away in a deposition and etching process as typically used for aluminum metallization. Thus, the copper interconnect 102 is typically formed by etching the trench 104 as an opening within the insulating layer 106, and the trench 104 is then filled with copper typically by an electroplating process, as known to one of ordinary skill in the art of integrated circuit fabrication.

Unfortunately, copper is a mid-bandgap impurity in silicon and silicon dioxide. Thus, copper may diffuse easily into these common integrated circuit materials. Referring to FIG. 1, the insulating layer 106 may be comprised of silicon dioxide or a low dielectric constant insulating material such as organic doped silica, as known to one of ordinary skill in the art of integrated circuit fabrication. The low dielectric constant insulating material has a dielectric constant that is lower than that of pure silicon dioxide ($SiO_2$) for lower capacitance of the interconnect, as known to one of ordinary skill in the art of integrated circuit fabrication.

Copper may easily diffuse into such an insulating layer 106, and this diffusion of copper may degrade the performance of the integrated circuit. Thus, a diffusion barrier material 110 is deposited to surround the copper interconnect 102 within the insulating layer 106 on the sidewalls and the bottom wall of the copper interconnect 102, as known to one of ordinary skill in the art of integrated circuit fabrication. The diffusion barrier material 110 is disposed between the copper interconnect 102 and the insulating layer 106 for preventing diffusion of copper from the copper interconnect 102 to the insulating layer 106 to preserve the integrity of the insulating layer 106.

Further referring to FIG. 1, an encapsulating layer 112 is deposited as a passivation layer to encapsulate the copper interconnect 102, as known to one of ordinary skill in the art of integrated circuit fabrication. The encapsulating layer 112 is typically comprised of a dielectric such as silicon nitride, and copper from the copper interconnect 102 does not easily diffuse into such a dielectric of the encapsulating layer 112.

As the density of integrated circuit structures continually increases, the distance between the interconnect structures decreases. As the distance between the interconnect structures decreases, a dielectric material with a low dielectric constant (i.e., a low-K dielectric material) is desired for the insulating layer 106. The insulating layer 106 being comprised of the dielectric material with a low dielectric constant results in lower capacitance between the interconnect structures. Such lower capacitance results in higher speed performance of the integrated circuit and also in lower power dissipation. In addition, such lower capacitance results in lower cross-talk between the interconnect structures. Lower cross-talk between interconnect structures is especially advantageous when the interconnect structures are disposed closer together as device density continually increases.

Referring to FIG. 2, one example of a dielectric material with a low dielectric constant for the insulating layer 106 is a porous dielectric material having pores throughout as known to one of ordinary skill in the art of integrated circuit fabrication. An interconnect opening 116 is formed within the porous dielectric material of the insulating layer 106 for forming an interconnect structure within the interconnect opening 116. With the porous dielectric material for the insulating layer, the interconnect opening 106 has opened pores 118 at the sidewalls of the interconnect opening 116.

Referring to FIG. 3, in the prior art, as device dimensions continually decrease, a diffusion barrier material 120 that is as thin as possible is deposited on the sidewalls and the bottom wall of the interconnect opening 116. The diffusion barrier material 120 of FIG. 3 is similar to the diffusion barrier material 110 of FIG. 1. Because diffusion barrier materials generally have higher resistance than copper, the diffusion barrier material 120 in the prior art is deposited as thin as possible to minimize resistance of the interconnect structure formed within the interconnect opening 116.

However, the pores 114 of the insulating layer 106 range in size with the pores 114 having a mean diameter in a range of from about 10 Å (angstroms) to about 200 Å (angstroms), depending on the type of low-K dielectric material of the insulating layer 106. For example, for OSG (organic spin-on glass), the diameter of the pores are in a range of from about 10 Å (angstroms) to about 40 Å (angstroms) with the mean diameter being about 25 Å (angstroms). On the other hand, for hydrocarbon polymer material, the diameter of the pores are in a higher range being as high as 200 Å (angstroms).

When the thickness of the diffusion barrier material 120 is thinner than a radius of the pores 118 that are opened at the sidewalls of the interconnect opening 116, the diffusion barrier material 120 that is deposited in a conformal deposition process of the prior art does not completely fill such opened pores 118 at the sidewalls of the interconnect opening 116. Further referring to FIG. 3, when the diffusion barrier material 120 does not completely fill such opened pores 118 at the sidewalls of the interconnect opening 116, a seed layer of copper 122 that is deposited onto the diffusion barrier material 120 does not reach into the opened pores 118 at the sidewalls of the interconnect opening 116.

Referring to FIG. 4, when a copper conductive fill 124 is grown from the copper seed layer 122 for filling the interconnect opening 116, voids 126 are formed from the opened pores 118 at the sidewalls of the interconnect opening 116 because the opened pores 118 do not have the copper seed layer 122 deposited therein. Such voids 126 disadvantageously increase the probability of electromigration failure of the interconnect structure.

Nevertheless, use of porous dielectric material for the insulating layer 106 is desired for the low dielectric constant. Accordingly, a mechanism is desired for preventing formation of voids from opened pores at the sidewalls of the interconnect opening formed within the porous dielectric material.

SUMMARY OF THE INVENTION

Accordingly, in a general aspect of the present invention, a thicker diffusion barrier material is deposited to completely fill opened pores at the sidewalls of the interconnect opening formed within the porous dielectric material to prevent formation of voids from such opened pores.

In a general aspect of the present invention, for an interconnect structure within an interconnect opening formed within a porous dielectric material, a diffusion barrier material is deposited onto at least one sidewall of the interconnect opening. A thickness of the diffusion barrier material deposited on the sidewall is controlled to be equal to or greater than a radius of a pore that is opened at the sidewall to substantially fill the opened pore. The interconnect opening is then filled with a conductive fill material after the deposition of the diffusion barrier material.

In one embodiment of the present invention, the thickness of the diffusion barrier material is controlled to be equal to or greater than a mean radius of the pores that may be opened at the sidewall of the interconnect opening to substantially fill a majority of opened pores at the sidewall of the interconnect opening.

In a further embodiment of the present invention, the thickness of the diffusion barrier material is controlled to be equal to or greater than a radius of a largest pore that may be opened at the sidewall of the interconnect opening to substantially fill all opened pores at the sidewall of the interconnect opening.

In another embodiment of the present invention, at least a portion of the diffusion barrier material is directionally sputtered away from the bottom wall of the interconnect opening before the interconnect opening is filled with a conductive fill material after the deposition of the diffusion barrier material, to minimize the resistance of the interconnect structure. Such an embodiment with complete removal of the diffusion barrier material from the bottom wall of the interconnect opening is especially advantageous when the interconnect opening is a via hole or a dual damascene opening with another conductive interconnect structure at the bottom wall of the interconnect opening.

In this manner, because the opened pore at the sidewalls of the interconnect opening is completely filled before forming the conductive fill material, formation of a void from such an opened pore is prevented to minimize electromigration failure of the interconnect structure formed within a porous dielectric material. In addition, with removal of the diffusion barrier material at the bottom wall of the interconnect opening, resistance of the interconnect structure is also minimized.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, and 16 refer to elements having similar structure and function.

DETAILED DESCRIPTION

The present invention is described for formation of copper interconnect. However, the present invention may be practiced for minimizing electromigration failure and resistance for conductive fill of other types of interconnects, as would be apparent to one of ordinary skill in the art of integrated circuit fabrication from the description herein.

Figure 1:
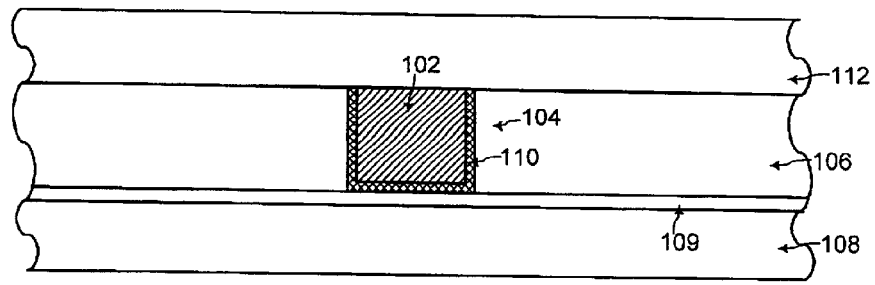
FIG. 1 shows a cross-sectional view of a copper interconnect formed by copper filling a trench within an insulating layer, according to the prior art.
Figure 2:
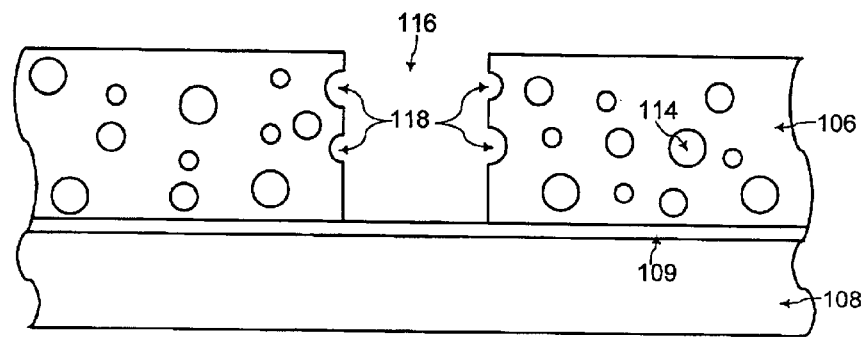
FIG. 2 shows a cross-sectional view of a porous dielectric material being used for the insulating layer surrounding the interconnect opening for forming the copper interconnect of FIG. 1.
Figure 3:
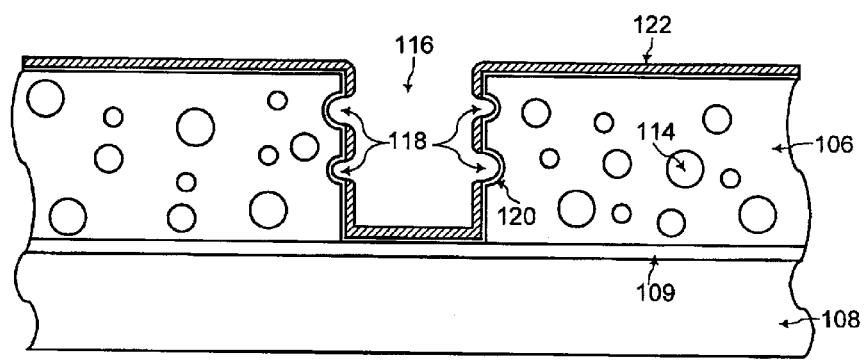
FIG. 3 shows a cross-sectional view of a thin diffusion barrier material being deposited without completely filling the opened pores at the sidewalls of the interconnect opening of FIG. 2, according to the prior art.
Figure 4:
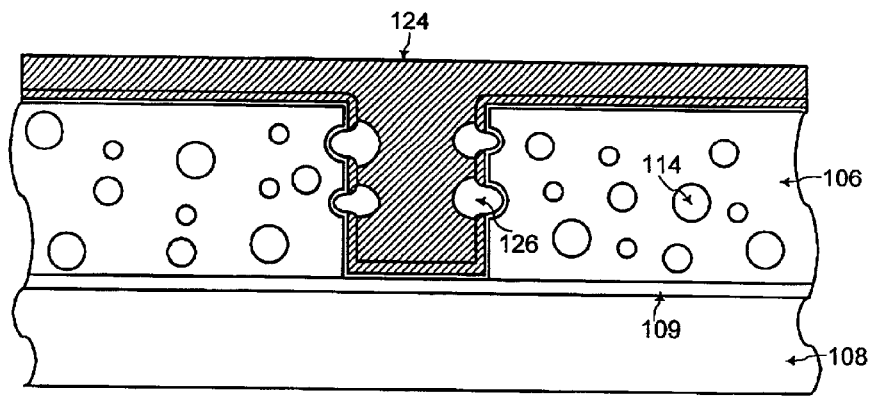
FIG. 4 shows a cross-sectional view of an interconnect structure with void formation when the opened pores at the sidewalls of the interconnect opening are not completely filled, according to the prior art.
Figure 5:
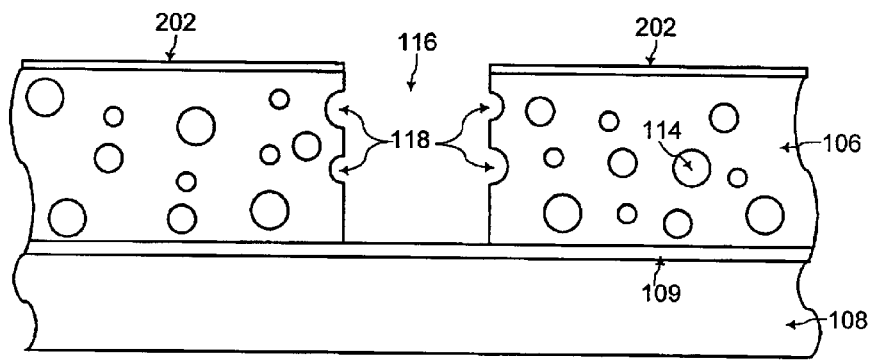
FIGS. 5, 6, and 7 show cross-sectional views for forming an interconnect structure within an interconnect opening formed within a porous dielectric material with thicker diffusion barrier material completely filling the opened pores at the sidewalls of the interconnect opening to prevent formation of voids, according to an embodiment of the present invention.

Referring to FIG. 5, the interconnect opening 116 is formed within the insulating layer 106 comprised of porous dielectric material having a low dielectric constant. In addition, the integrated circuit opening is formed on a layer of the dense dielectric material 109 deposited on the semiconductor wafer 108. The dense dielectric material 109 may be a hardmask layer, an etch stop layer, or a capping layer comprised of $SiO_2$ (silicon dioxide) or SiN (silicon nitride) for example. Thus, the sidewalls of the interconnect opening 116 has opened pores 118, as described in the prior art. Referring to FIG. 5, in one embodiment of the present invention, a capping dielectric layer 202 is formed on the top surface of the insulating layer 106 before the interconnect opening 116 is formed such that the capping dielectric layer 202 remains on the top surface of the insulating layer 106 surrounding the interconnect opening 116.

In one embodiment of the present invention, the capping dielectric layer 202 is comprised of a hardmask dielectric material such as (SiN) silicon nitride for example, and processes for forming such a capping dielectric layer 202 are known to one of ordinary skill in the art of integrated circuit fabrication. The present invention may be practiced with or without the capping dielectric layer 202. In addition, processes for patterning and etching the capping dielectric layer 202 and the insulating layer 106 for forming the interconnect opening 116 are known to one of ordinary skill in the art of integrated circuit fabrication.

Figure 6:
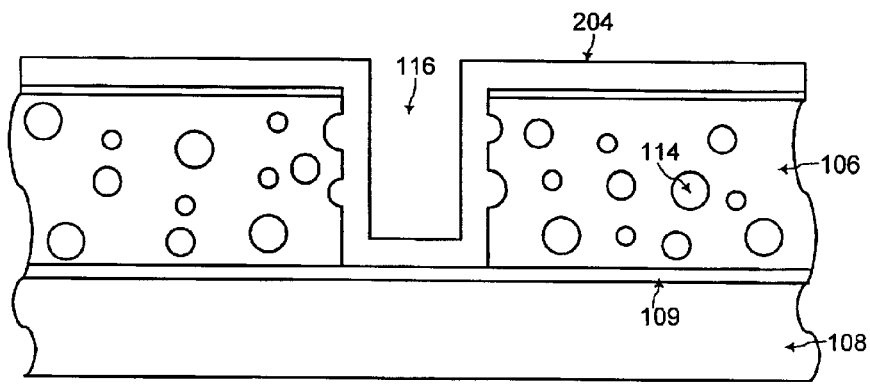

Referring to FIG. 6, a diffusion barrier material 204 is conformally deposited onto the sidewalls and the bottom wall of the interconnect opening 116. According to a general aspect of the present invention, the thickness of the diffusion barrier material 204 is controlled to be greater than in the prior art and is controlled to be equal to or greater than a radius of an opened pore 118 at the sidewalls of the interconnect opening 116 to completely fill such an opened pore.

The pores of the insulating layer 106 range in size with the pores having a mean diameter in a range of from about 10 Å (angstroms) to about 200 Å (angstroms), depending on the type of low-K dielectric material of the insulating layer 106. For example, for OSG (organic spin-on glass), the diameter of the pores are in a range of from about 10 Å (angstroms) to about 40 Å (angstroms) with the mean diameter being about 25 Å (angstroms). On the other hand, for hydrocarbon polymer material, the diameter of the pores are in a higher range being as high as 200 Å (angstroms).

In one embodiment of the present invention, the thickness of the diffusion barrier material 204 is controlled to be equal to or greater than a mean radius of the pores that may be opened at the sidewalls of the interconnect opening to substantially fill a majority of opened pores at the sidewalls. For example, for a low-K dielectric material having a mean pore diameter of 50 Å (angstroms), the thickness of the diffusion barrier material 204 is desired to be equal to or greater than about 25 Å (angstroms). In another embodiment of the present invention, the thickness of the diffusion barrier material 204 is controlled to be equal to or greater than a radius of a largest pore that may be opened at the sidewalls of the interconnect opening 116 to substantially fill all opened pores 118 at the sidewalls.

For some conformal deposition processes for depositing the diffusion barrier material 204, the thickness of the diffusion barrier material deposited on the field region surrounding the interconnect opening may be larger than the thickness of the diffusion barrier material deposited on the sidewalls and bottom wall of the interconnect opening. For example, the thickness of the diffusion barrier material deposited on the sidewalls and bottom wall of the interconnect opening may be in a range of from about 40% to 100% of the thickness of the diffusion barrier material deposited on the field region surrounding the interconnect opening. In that case, the thickness of the diffusion barrier material deposited on the field region is scaled to ensure that the thickness of the diffusion barrier material deposited on the sidewalls and bottom wall of the interconnect opening has sufficient thickness for filling the opened pores at the sidewalls of the interconnect opening.

In one embodiment of the present invention, for formation of copper interconnect, the diffusion barrier material 204 is comprised of at least one of TiN (titanium nitride), TiSiN (titanium silicon nitride), TaN (tantalum nitride), TaSiN (tantalum silicon nitride), Ta (tantalum), W (tungsten), WN (tungsten nitride), WC (tungsten carbide), and Ru (ruthenium), or a combination of such example diffusion barrier materials. Deposition processes for forming such a conformal diffusion barrier material 204, such as a conformal CVD (chemical vapor deposition) process or a conformal ALD (atomic layer deposition) process, are known to one of ordinary skill in the art of integrated circuit fabrication. In addition, mechanisms for controlling the thickness of the diffusion barrier material 204 in such deposition processes are known to one of ordinary skill in the art of integrated circuit fabrication.

Figure 7:
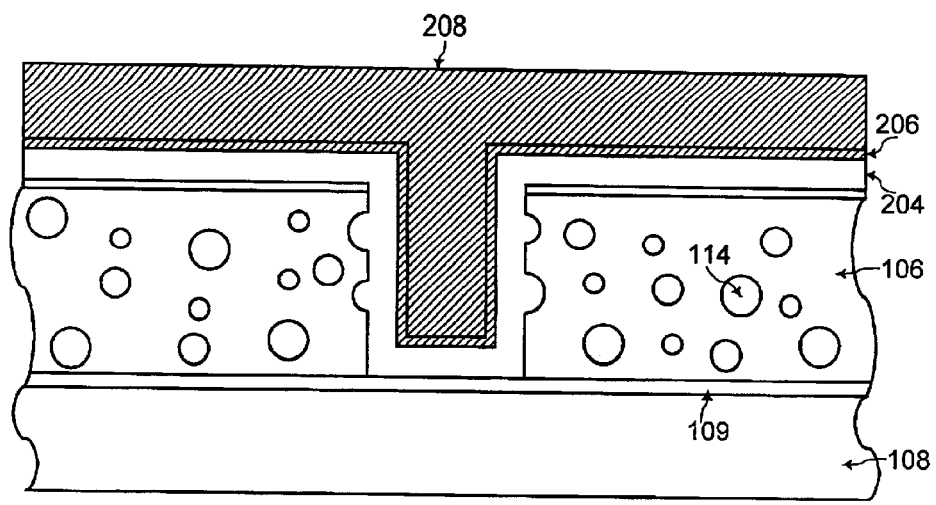

Referring to FIG. 7, after deposition of the diffusion barrier material 204, the interconnect opening 116 is completely filled with a conductive fill material such as copper for example. In one embodiment of the present invention, a copper seed layer 206 is deposited onto the diffusion barrier material 204, and then the copper conductive fill 208 is grown from the copper seed layer 206 using an ECD (electrochemical deposition) process. Alternatively, the copper conductive fill material is formed without the copper seed layer 206 in an electroless copper deposition process. Such processes for forming the conductive fill material for completely filling the interconnect opening 116 are known to one of ordinary skill in the art of integrated circuit fabrication.

Figure 8:
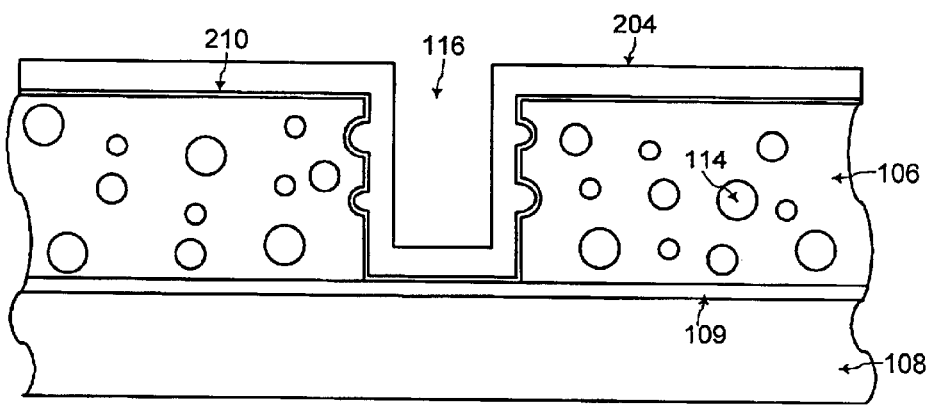
FIGS. 8 and 9 show cross-sectional views including an additional diffusion barrier material deposited in the interconnect structure of FIGS. 5, 6, and 7, according to another embodiment of the present invention.

Referring to FIG. 8, in another embodiment of the present invention, an additional diffusion barrier material 210 that is different from the diffusion barrier material 204 of FIGS. 6 and 7 may also be deposited between the porous dielectric material of the insulating layer 106 and the diffusion barrier material 204. For example, the additional diffusion barrier material 210 that is thinner as in the prior art may be deposited onto the sidewalls and the bottom wall of the interconnect opening before the diffusion barrier material 204 when the additional diffusion barrier material 210 provides better adhesion properties to the porous dielectric material of the insulating layer 106. Processes for forming such additional diffusion barrier material 210 between the porous dielectric material of the insulating layer 106 and the diffusion barrier material 204 are known to one of ordinary skill in the art of integrated circuit fabrication.

Figure 9:
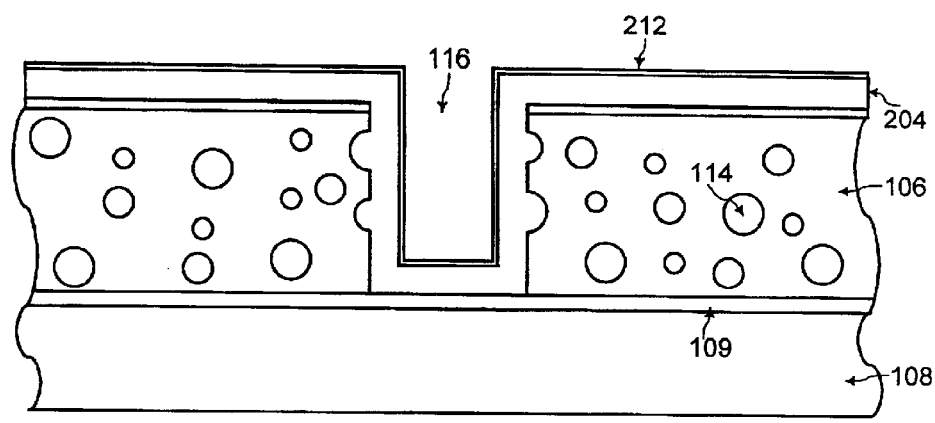

Alternatively, referring to FIG. 9, an additional diffusion barrier material 212 that is different from the diffusion barrier material 204 of FIGS. 6 and 7 may also be deposited on the diffusion barrier material 204 before the interconnect opening 116 is filled with the conductive fill material 208. For example, the additional diffusion barrier material 212 that is thinner as in the prior art may be deposited on the diffusion barrier material 204 when the additional diffusion barrier material 212 provides better adhesion properties between the diffusion barrier material 204 and the fill conductive material 208. Processes for forming such additional diffusion barrier material 212 between the diffusion barrier material 204 and the conductive fill material 208 are known to one of ordinary skill in the art of integrated circuit fabrication. Or, the additional diffusion barrier materials 210 or 212 may be comprised of other types of material, such as adhesion promoting materials for example, that are not necessarily diffusion barrier materials for providing additional beneficial properties to the interconnect structure formed within the interconnect opening 116 as known to one of ordinary skill in the art of integrated circuit fabrication.

In any case, when additional material 210 or 212 is also deposited onto the sidewalls of the interconnect opening, then the thickness of the diffusion barrier material may be reduced to still fill the opened pores at the sidewalls of the interconnect opening. In that case, the total thickness of all of the materials, including the diffusion barrier material 204 and any additional material, conformally deposited onto the sidewalls of the interconnect opening is controlled to be equal to or greater than the mean radius or the greatest radius of opened pores at the sidewalls of the interconnect opening.

Figure 10:
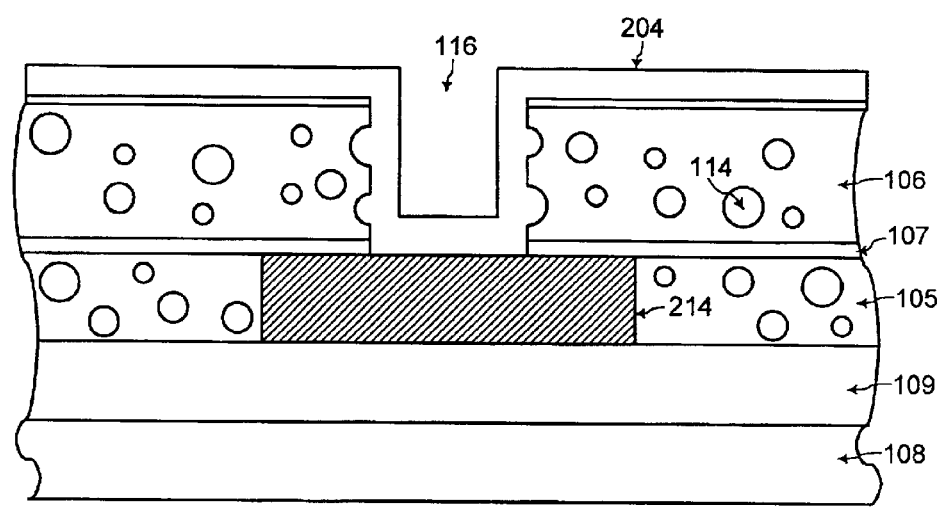
FIG. 10 illustrates the interconnect opening as a via hole formed above a conductive interconnect structure, according to one embodiment of the present invention.
Figure 11:
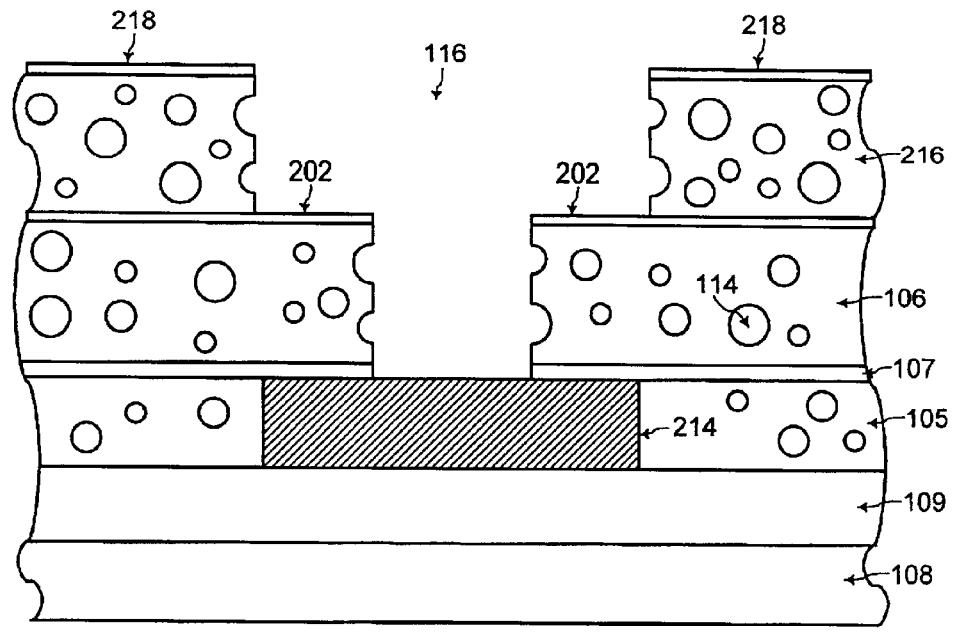
FIG. 11 illustrates the interconnect opening as a dual damascene opening formed above a conductive interconnect structure, according to another embodiment of the present invention.

In FIGS. 6, 7, 8, and 9, the interconnect opening 116 is a trench for a metal line. In another embodiment of the present invention, the interconnect opening 116 may be formed over a conductive interconnect structure. Referring to FIG. 10, the interconnect opening 116 is a via hole formed over a conductive interconnect structure 214. Referring to FIG. 11, the interconnect opening 116 is a dual damascene opening formed over the conductive interconnect structure 214 that is formed on a layer of dense dielectric material 109. The conductive interconnect structure 214 is formed within another layer of porous dielectric material 105 capped by a hardmask material 107.

In the dual damascene opening 116 of FIG. 11, both a lower opening is formed within the bottom insulating layer 106 for forming a via plug to the conductive interconnect structure 214, and an upper opening is formed in an upper insulating layer 216 also comprised of porous dielectric material similar to the bottom insulating layer 106. An additional capping dielectric layer 218 is formed on the top surface of the upper insulating layer 216 surrounding the interconnect opening. The upper opening formed in the upper insulating layer 216 is for an upper conductive interconnect structure. With the dual damascene opening 116 of FIG. 11, the via structure and the upper conductive interconnect structure are formed substantially simultaneously on the lower conductive interconnect structure 214.

Such a dual damascene opening and such a via hole are known to one of ordinary skill in the art of integrated circuit fabrication. In the via hole 116 of FIG. 10 or in the dual damascene opening 116 of FIG. 11, the conductive material of the conductive interconnect structure 214 forms the bottom wall of the interconnect opening 116 before deposition of the thick diffusion barrier material 204.

In another aspect of the present invention, for the metal line, the via hole, or the dual damascene opening, at least a portion of the diffusion barrier material 204 is directionally sputtered away from the bottom wall of the interconnect opening 116 after deposition of the diffusion barrier material 204 and before filling the interconnect opening with the conductive fill material. Typically, the diffusion barrier material 204 has higher resistance than the conductive fill material. Thus, minimizing the volume of the diffusion barrier material 204 within the interconnect opening 116 and in turn maximizing the volume of the conductive fill material within the interconnect opening 116 minimizes resistance of the interconnect structure formed within the interconnect opening 116.

Figure 12:
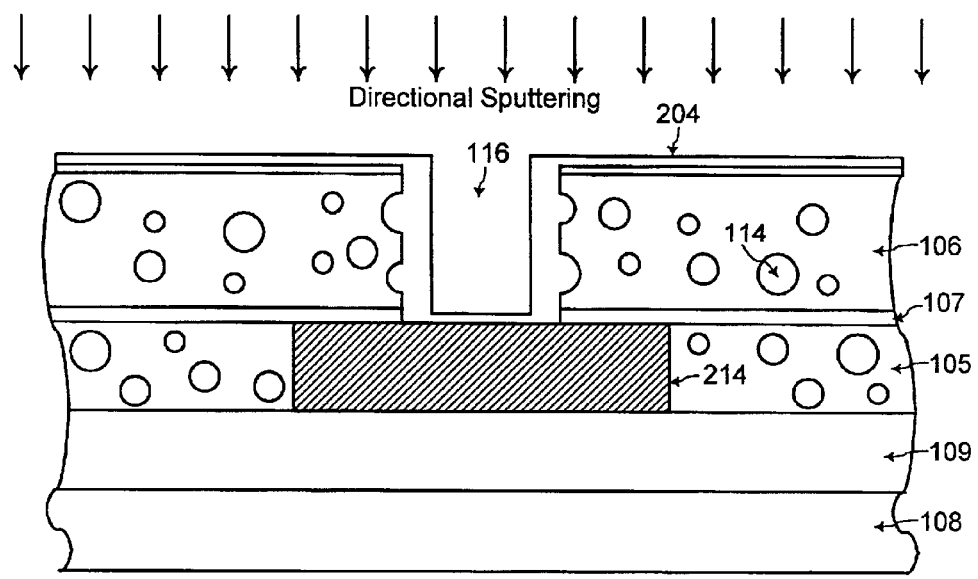
FIG. 12 illustrates a directional sputtering process for removing the diffusion barrier material from the bottom wall of the interconnect opening that is a via hole, according to one embodiment of the present invention.

Referring to FIG. 12, a directional sputtering process is used to sputter away at least a portion of the diffusion barrier material 204 from the bottom wall of the via hole 116 after deposition of the diffusion barrier material 204 and before filling the interconnect opening with the conductive fill material. With a directional sputtering process, the diffusion barrier material 204 on any horizontal surface such as the bottom wall of the interconnect opening 116 and on the top surface of the capping dielectric layer 202 is sputtered away while the diffusion barrier material 204 on the sidewalls of the interconnect opening 116 remains substantially unaffected. Directional sputtering processes are known to one of ordinary skill in the art of integrated circuit fabrication.

Figure 13:
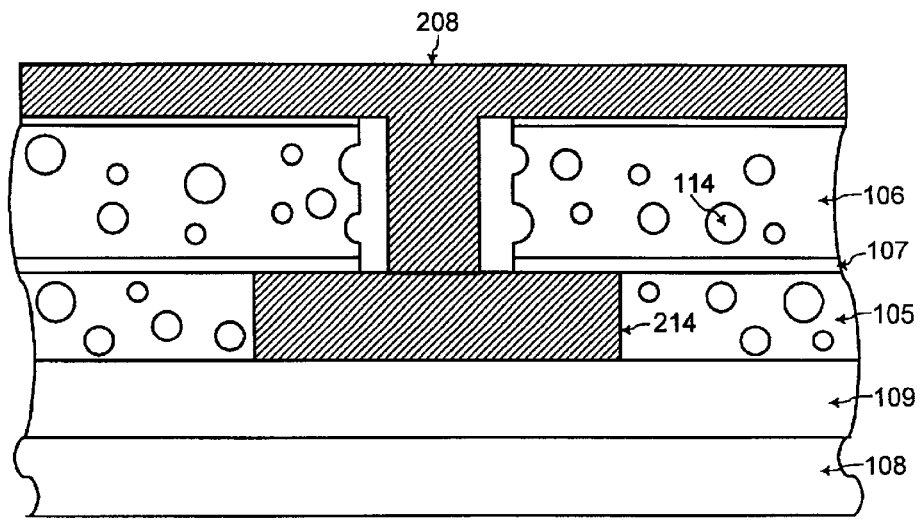
FIG. 13 illustrates formation of the conductive fill material after removal of the diffusion barrier material from the bottom wall of the interconnect opening that is the via hole of FIG. 12, according to one embodiment of the present invention.

Referring to FIG. 13, in one embodiment of the present invention, the diffusion barrier material 204 is completely sputtered away from the bottom wall of the via hole 116 and the top surface of the capping dielectric layer 202 in the directional sputtering process of FIG. 12. When the conductive fill material 208 is formed to fill the interconnect opening 116 with the diffusion barrier material 204 completely sputtered away from the bottom wall of the interconnect opening 116, the resistance of the interconnect structure formed with the interconnect opening 116 is minimized.

For the via hole, if the diffusion barrier material 204 is a dielectric material, then the diffusion barrier material 204 is completely sputtered away from the bottom wall of the via hole 116 such that the conductive fill material forming the via plug makes electrical contact with the lower conductive interconnect structure 214. On the other hand, if the diffusion barrier material 204 is a conductive material, then only a portion of the diffusion barrier material 204 may be sputtered away from the bottom wall of the interconnect opening 116 with the conductive fill material forming the via plug still being electrically coupled to the lower conductive interconnect structure 214.

Referring to Figs. FIGS. 6, 7, 8, and 9, when the interconnect opening 116 is a trench for a metal line, and the bottom wall of the interconnect opening 116 is formed by the layer of dense dielectric material 109, then only a portion of the diffusion barrier material 204 may be sputtered away from the bottom wall of the interconnect opening 116. In that case, the remaining portion of the diffusion barrier material prevents diffusion of the copper conductive fill into the layer of dense dielectric material 109.

Figure 14:
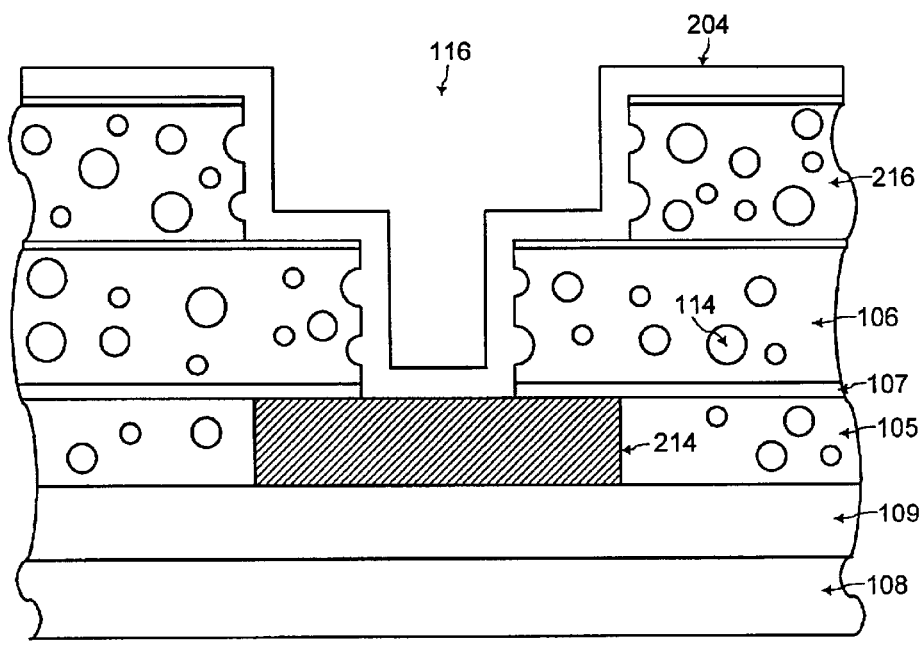
FIG. 14 illustrates formation of the thicker diffusion barrier material for filling any opened pores at the sidewalls of the interconnect opening that is the dual damascene opening of FIG. 11, according to one embodiment of the present invention.

Referring to FIG. 14, when the interconnect opening 116 is the dual damascene opening, the diffusion barrier material 204 is conformally deposited onto exposed surfaces of the dual damascene opening 116. The thickness of the diffusion barrier material 204 is controlled to be equal to or greater than a radius of a largest pore that may be opened at the sidewalls of the interconnect opening 116 to substantially fill all opened pores 118 at the sidewalls.

Figure 15:
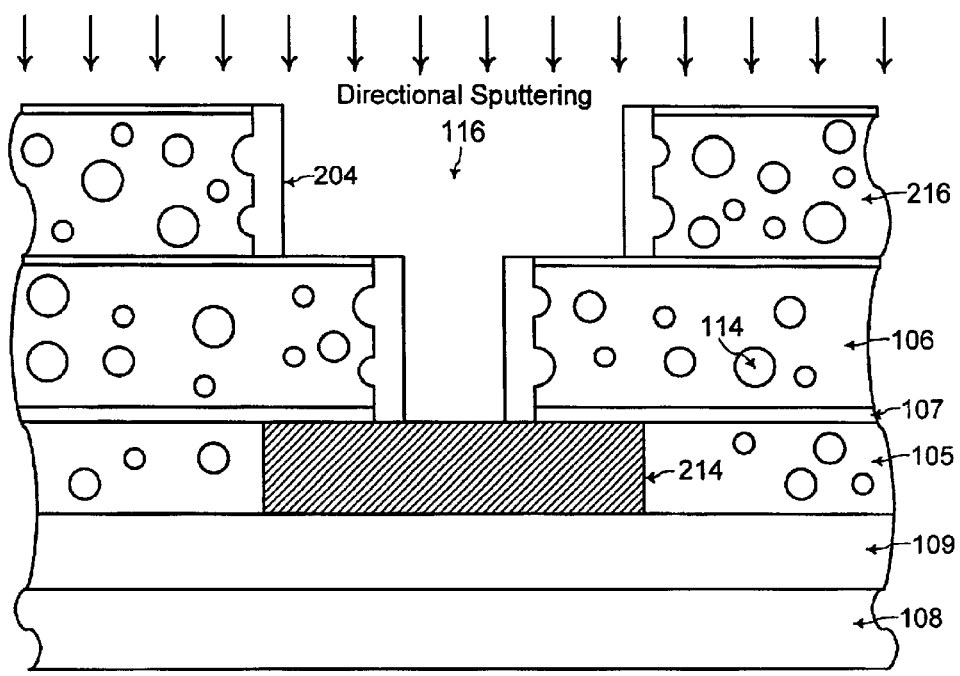
FIG. 15 illustrates a directional sputtering process for removing the diffusion barrier material from the bottom wall of the interconnect opening that is the dual damascene opening of FIG. 14, according to one embodiment of the present invention.
Figure 16:
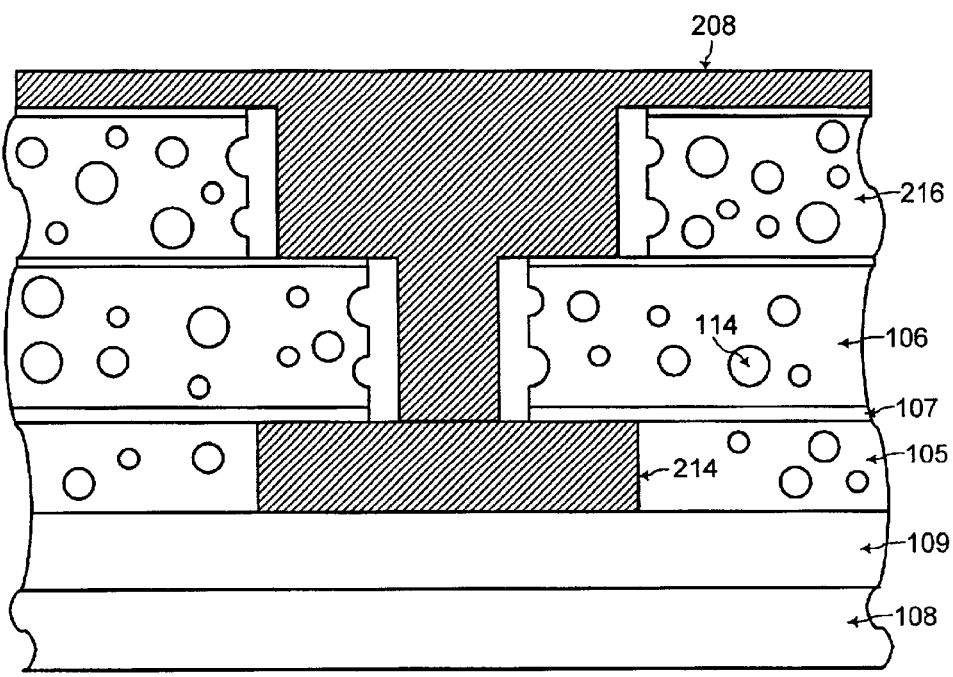
FIG. 16 illustrates formation of the conductive fill material after removal of the diffusion barrier material from the bottom wall of the interconnect opening that is the dual damascene opening of FIG. 15, according to one embodiment of the present invention.

Referring to FIG. 15, for the dual damascene opening 116, a directional sputtering process is performed to sputter away the diffusion barrier from any horizontal surface of the dual damascene opening 116, especially the bottom wall of the interconnect opening 116 formed by the bottom conductive interconnect structure 214. The diffusion barrier material 204 remains substantially unaffected at the sidewalls of the dual damascene opening 116 after the directional sputtering process. Referring to FIG. 16, the conductive fill material 208 is then formed to fill the dual damascene opening 116 with minimized resistance.

For the dual damascene opening also, if the diffusion barrier material 204 is a dielectric material, then the diffusion barrier material 204 is completely sputtered away from the bottom wall of the dual damascene opening 116 such that the conductive fill material a within the dual damascene opening 116 makes electrical contact with the lower conductive interconnect structure 214. On the other hand, if the diffusion barrier material 204 is a conductive material, then only a portion of the diffusion barrier material 204 may be is sputtered away from the bottom wall of the dual damascene opening 116 with the conductive fill material within the dual damascene opening still being electrically coupled to the lower conductive interconnect structure 214.

In this manner, because the opened pores at the sidewalls of the interconnect opening are completely filled before forming the conductive fill material, formation of voids from such opened pores is prevented to minimize electromigration failure of the interconnect structure formed within a porous dielectric material. In addition, with removal of the diffusion barrier material at the bottom wall of the interconnect opening, resistance of the interconnect structure is also minimized.

The foregoing is by way of example only and is not intended to be limiting. For example, the present invention is described for formation of copper interconnect. However, the present invention may be practiced for minimizing electromigration failure and resistance with conductive fill of other types of interconnects, as would be apparent to one of ordinary skill in the art of integrated circuit fabrication from the description herein. In addition, formation of a metal line, a via hole, and a dual damascene opening are illustrated. However, the present invention may be practiced with other types of interconnect openings, as would be apparent to one of ordinary skill in the art of integrated circuit fabrication from the description herein. More specifically, the present invention may be practiced with the metal line, the via hole, and the dual damascene opening formed with different layers of material surrounding such openings, as would be apparent to one of ordinary skill in the art of integrated circuit fabrication from the description herein.

Furthermore, the meaning of opened pore as used herein and in the following claims refers to the final opened pore structure that results from any conformal deposition of additional material (aside from just the diffusion barrier material) onto the sidewalls of the interconnect opening. When such additional material is also deposited onto the sidewalls of the interconnect opening, then the thickness of the diffusion barrier material may be reduced to still fill the final opened pore structures at the sidewalls of the interconnect opening. In that case, the total thickness of all of the materials, including the diffusion barrier material 204 and any additional material, conformally deposited onto the sidewalls of the interconnect opening is controlled to be equal to or greater than the mean radius or the greatest radius of opened pores at the sidewalls of the interconnect opening.

Additionally, as will be understood by those skilled in the art, the structures described herein may be made or used in the same way regardless of their position and orientation. Accordingly, it is to be understood that terms and phrases such as "top," "bottom," and "side" as used herein refer to relative location and orientation of various portions of the structures with respect to one another, and are not intended to suggest that any particular absolute orientation with respect to external objects is necessary or required. The present invention is limited only as defined in the following claims and equivalents thereof.

We claim:

1. A method of filling an interconnect opening within a porous dielectric material, including the steps of:
    depositing a diffusion barrier material onto at least one sidewall of the interconnect opening;
    controlling a thickness of the diffusion barrier material to be equal to or greater than a radius of a pore that is opened at the sidewall to substantially fill the opened pore; and
    filling the interconnect opening with a conductive fill material.

2. The method of claim 1, further comprising:
    controlling the thickness of the diffusion barrier material to be equal to or greater than a mean radius of pores that are opened at the sidewall to substantially fill a majority of the opened pores.

3. The method of claim 1, further comprising:
    controlling the thickness of the diffusion barrier material to be equal to or greater than a radius of a largest pore opened at the sidewall to substantially fill all opened pores at the sidewall.

4. The method of claim 1, further including the step of:
    directionally sputtering away just a portion of the diffusion barrier material deposited onto a bottom wall of the interconnect opening.

5. The method of claim 1, further including the step of:
    directionally sputtering away substantially all of the diffusion barrier material deposited onto a bottom wall of the interconnect opening.

6. The method of claim 1, further including the step of:
    directionally sputtering away the diffusion barrier material from a top surface of the porous dielectric material surrounding the interconnect opening.

7. The method of claim 1, further including the step of:
    forming a capping dielectric layer on a top surface of the porous dielectric material surrounding the interconnect opening.

8. The method of claim 1, further including the step of:
    depositing an additional diffusion barrier material onto the at least one sidewall, wherein a total thickness of the diffusion barrier materials is equal to or greater than the radius of the pore.

9. The method of claim 1, wherein the conductive fill material is comprised of copper, and wherein the diffusion barrier material is comprised of at least one of TiN (titanium nitride), TiSiN (titanium silicon nitride), TaN (tantalum nitride), TaSiN (tantalum silicon nitride), Ta (tantalum), W (tungsten), WN (tungsten nitride), WC (tungsten carbide), and Ru (ruthenium).

10. The method of claim 9, wherein the diffusion barrier material is deposited in a conformal CVD (chemical vapor deposition) process or a conformal ALD (atomic layer deposition) process.

11. The method of claim 9, wherein the step of filling the interconnect opening with copper includes the step of:

depositing a copper seed layer and then growing the copper conductive fill from the copper seed layer using an ECD (electrochemical deposition) process.

12. The method of claim 9, wherein the copper conductive fill material is formed in an electroless copper deposition process.

13. The method of claim 1, wherein the interconnect opening is one of a metal line, a via hole, or a dual damascene opening.

14. A method for fabricating a copper interconnect structure within an interconnect opening formed within a porous dielectric material, the method comprising the steps of:

A. forming a capping dielectric layer on a top surface of the porous dielectric material surrounding the interconnect opening;

B. depositing a diffusion barrier material onto at least one sidewall and a bottom wall of the interconnect opening;

wherein the diffusion barrier material is comprised of at least one of TiN (titanium nitride), TiSiN (titanium silicon nitride), TaN (tantalum nitride), TaSiN (tantalum silicon nitride), Ta (tantalum), W (tungsten), WN (tungsten nitride), WC (tungsten carbide), and Ru (ruthenium);

and wherein the diffusion barrier material is deposited in a conformal CVD (chemical vapor deposition) process or a conformal ALD (atomic layer deposition) process;

and wherein the interconnect opening is one of a metal line, a via hole, or a dual damascene opening;

C. controlling the thickness of the diffusion barrier material deposited on the sidewall and the bottom wall to be equal to or greater than a radius of a largest pore that may be opened at the sidewall of the interconnect opening to completely fill all opened pores at the sidewall;

D. directionally sputtering away the diffusion barrier material from the bottom wall of the interconnect opening and from a top surface of the porous dielectric material surrounding the interconnect opening;

E. depositing an additional diffusion barrier material onto exposed surfaces within the interconnect opening; and F. filling the interconnect opening with a conductive fill material after the deposition of the diffusion barrier material, wherein the conductive fill material is comprised of copper.

* * * * *